(12) United States Patent
Al-Anbuky et al.

(10) Patent No.: US 7,402,980 B2
(45) Date of Patent: Jul. 22, 2008

(54) METHODS APPARATUS AND COMPUTER PROGRAM PRODUCTS FOR BATTERY MONITORING USING PREDETERMINED BATTERY DISCHARGE CHARACTERISTICS

(75) Inventors: Adnan H. Al-Anbuky, Christchurch (NZ); Phillip E. Pascoe, Christchurch (NZ)

(73) Assignee: Eaton Power Quality Company, Christchurch (NZ)

( * ) Notice: Subject to any disclaimer, the term of this patent is extended or adjusted under 35 U.S.C. 154(b) by 188 days.

(21) Appl. No.: 10/559,367

(22) PCT Filed: Jun. 3, 2004

(86) PCT No.: PCT/NZ2004/000117

§ 371 (c)(1),
(2), (4) Date: May 10, 2006

(87) PCT Pub. No.: WO2004/109311

PCT Pub. Date: Dec. 16, 2004

(65) Prior Publication Data

US 2006/0226843 A1 Oct. 12, 2006

(30) Foreign Application Priority Data

Jun. 6, 2003 (NZ) .................................. 526320

(51) Int. Cl.
*H01M 10/46* (2006.01)
(52) U.S. Cl. .......................................... 320/132
(58) Field of Classification Search ............... 320/132, 320/149; 324/426, 427, 433
See application file for complete search history.

(56) References Cited

U.S. PATENT DOCUMENTS

| 4,231,026 | A | | 10/1980 | Sullivan |
| 4,952,862 | A | * | 8/1990 | Biagetti et al. ............. 320/132 |
| 5,631,540 | A | * | 5/1997 | Nguyen .................... 320/127 |
| 5,936,383 | A | | 8/1999 | Ng |
| 5,977,750 | A | | 11/1999 | Ng |
| 6,081,096 | A | | 6/2000 | Barkat |
| 6,106,968 | A | | 8/2000 | Johnson |
| 6,137,292 | A | | 10/2000 | Hirsch |
| 6,411,911 | B1 | | 6/2002 | Hirsch |

FOREIGN PATENT DOCUMENTS

WO WO97/41448 6/1997

* cited by examiner

*Primary Examiner*—Edward Tso
(74) *Attorney, Agent, or Firm*—Myers Bigel Sibley & Sajovec

(57) ABSTRACT

A method of battery monitoring including the steps of: acquiring a battery voltage measurement from the battery; and acquiring a time measurement associated with the battery voltage measurement. A scaled voltage value is determined by scaling the battery voltage measurement with respect to a start voltage and/or predetermined end voltage. A scaled time value is determined from the scaled voltage value in accordance with a predetermined battery characteristic. An absolute reserve time value is then obtained from the scaled time value, the reserve time being indicative of the difference between the time measurement and an end time associated with the predetermined end voltage.

37 Claims, 10 Drawing Sheets

METHODS APPARATUS AND COMPUTER PROGRAM PRODUCTS FOR BATTERY MONITORING USING PREDETERMINED BATTERY DISCHARGE CHARACTERISTICS

RELATED APPLICATIONS

The present application is a 35 U.S.C. § 371 national phase application of PCT International Application No. PCT/NZ2004/000117, having an international filing date of Jun. 3, 2004 and claiming priority to New Zealand Patent Application No. 526320, filed Jun. 6, 2003, the disclosures of which are incorporated herein by reference in their entireties. The above PCT International Application was published in the English language and has International Publication No. WO 2004/109311.

The present invention relates to methods and apparatus for battery monitoring and characterisation Discharge reserve time can be defined as the amount of time a battery (such as a Valve Regulated Lead Acid, VRLA battery) can supply power to a load. Alternatively, it can be defined as the length of time the battery takes to be discharged (where the stored energy is removed) until its terminal voltage reaches a predefined end voltage. This end voltage is defined by the operator and is ultimately determined by the equipment (load) that the battery is connected to (discharged into). Both scaled and absolute reserve time can be estimated. Scaled reserve time is a dimensionless quantity between 1 and zero, which is proportional to the reserve time. In this case a scaled reserve time of one correlates to full charge remaining or maximum reserve time, while a scaled reserve time of zero correlates to no charge remaining or no reserve time. Absolute reserve time is the discharge reserve time in time units.

A conventional system is described in U.S. Pat. No. 6,411,911. Here normalised time and voltage values are calculated and used to discharge a battery down to a predetermined percentage discharge value. The normalised voltage values are calculated by normalising absolute voltage readings with respect to a peak voltage or foothill voltage. A battery reserve time is estimated once at the end of the process. This reserve time equals the discharge time multiplied by the ratio of 100 divided by the percent discharge desired.

A first aspect of the invention provides a method of battery monitoring including the steps of:
a) acquiring a battery voltage measurement from the battery;
b) acquiring a time measurement associated with the battery voltage measurement acquired in step a);
c) determining a scaled voltage value by scaling the battery voltage measurement made in step a) with respect to a predetermined end voltage;
d) determining a scaled time value from the scaled voltage value determined in step c) in accordance with a predetermined battery characteristic; and
e) obtaining a reserve time from the scaled time value determined in step d), the reserve time being indicative of the difference between the time measurement acquired in step b) and an end time associated with the predetermined end voltage.

The first aspect of the invention provides a more useful indicator than the reserve time value given in U.S. Pat. No. 6,411,911. That is, the reserve time according to the first aspect of the invention is indicative of the difference between the time measurement acquired in step b) and an end time associated with the predetermined end voltage.

A second aspect of the invention provides a method of battery monitoring including the steps of:

a) acquiring a battery voltage measurement from the battery;
b) acquiring a time measurement associated with the battery voltage measurement acquired in step a);
c) determining a scaled voltage value by scaling the battery voltage measurement made in step a) with respect to a start voltage and a predetermined end voltage;
d) determining a scaled time value from the scaled voltage value determined in step c) in accordance with a predetermined battery discharge characteristic; and
e) obtaining an absolute time value from the scaled time value determined in step d).

The second aspect of the invention utilizes the discovery that improved accuracy can result from scaling the voltage measurements both with respect to a start voltage and an end voltage. In contrast, U.S. Pat. No. 6,411,911 only normalises with respect to a start voltage.

The absolute time value may be a total battery reserve time (as disclosed in U.S. Pat. No. 6,411,911) indicative of the time difference between a start time (for instance the time of the first voltage measurement) and an end time associated with the predetermined end voltage. However preferably the absolute time value is indicative of the time difference between the time measurement acquired in step b) and an end time associated with the predetermined end voltage.

Steps a)-e) may be performed once only, but typically one or more additional repeats of steps a)-e) are performed during a single battery discharge.

In a preferred embodiment, step e) includes the steps of: e)i) determining the difference between a lower time measurement and an upper time measurement; e)ii) determining the difference between a pair of scaled time values associated with the lower and upper time measurements; and e)iii) determining the ratio of the differences determined in steps e)i) and e)ii).

The lower and upper time measurements may change for each repeat of step e)—for instance they may be associated with a pair of adjacent repeats.

Alternatively the lower time measurement may be the same for each repeat of step e), and the upper time measurement changes for each repeat of step e).

Typically the battery voltage measurements include a measured start voltage (such as a plateau voltage) and the scaled voltage value is determined in step c) by scaling the battery voltage measurement with respect to the measured start voltage and the predetermined end voltage.

The predetermined end voltage may be stored previously, or may be received from a user by means of a user input device such as a keyboard or mouse. This enables the end voltage to be specified by a user. In this case, the battery discharge characteristic may be re-scaled in accordance with the user input end voltage.

A third aspect of the invention provides a method of characterising a battery including:
a) acquiring a plurality of battery voltage measurements from the battery, the battery voltage measurements including a start voltage and an end voltage;
b) acquiring a plurality of time measurements, each time measurement being associated with a respective battery voltage measurement, the time measurements including an end time associated with the end voltage;
c) determining a plurality of scaled voltage values by scaling each battery voltage measurement with respect to the start voltage and the end voltage;
d) determining a plurality of scaled time values by scaling each time measurement with respect to the end time; and e) storing a battery discharge characteristic indicative of the relationship between the scaled voltage values and the scaled time values.

The stored battery discharge characteristic can then be used in step e) of the battery monitoring method described above.

The battery discharge characteristic provides robustness against possible variations in battery type, battery operating conditions (discharge rate, temperature) or battery conditions (battery type and reasonable variation in battery state of health).

The method typically requires voltage and time measurements from one full discharge of a given battery with a given condition and at a given operating condition. This is then employed to derive the battery discharge characteristic representing the relationship between the scaled voltage values and scaled time values. The relationship can then be used as the key computational component for any battery size, type or conditions.

A system configured to implement the method typically includes a sensor for acquiring the battery voltage measurements; a timer for generating the time measurements; and a processor for performing steps c) to e). The result of step e) can then be stored and/or output to a device such as a printer or display unit.

An embodiment of the invention will now be described with reference to the accompanying drawings, in which.

FIGS. 3a)-3f) are graphs illustrating the robustness of the scaling process for different operating conditions;

FIGS. 4a)-4b) are graphs illustrating the scaling process for two different end voltages, 1.9 and 1.65V/cell respectively;

FIGS. 5a)-5b) are graphs illustrating the scaling process for different battery types; and FIGS. 6a)-6f) are graphs illustrating the scaling process for different battery conditions.

Figure 7:
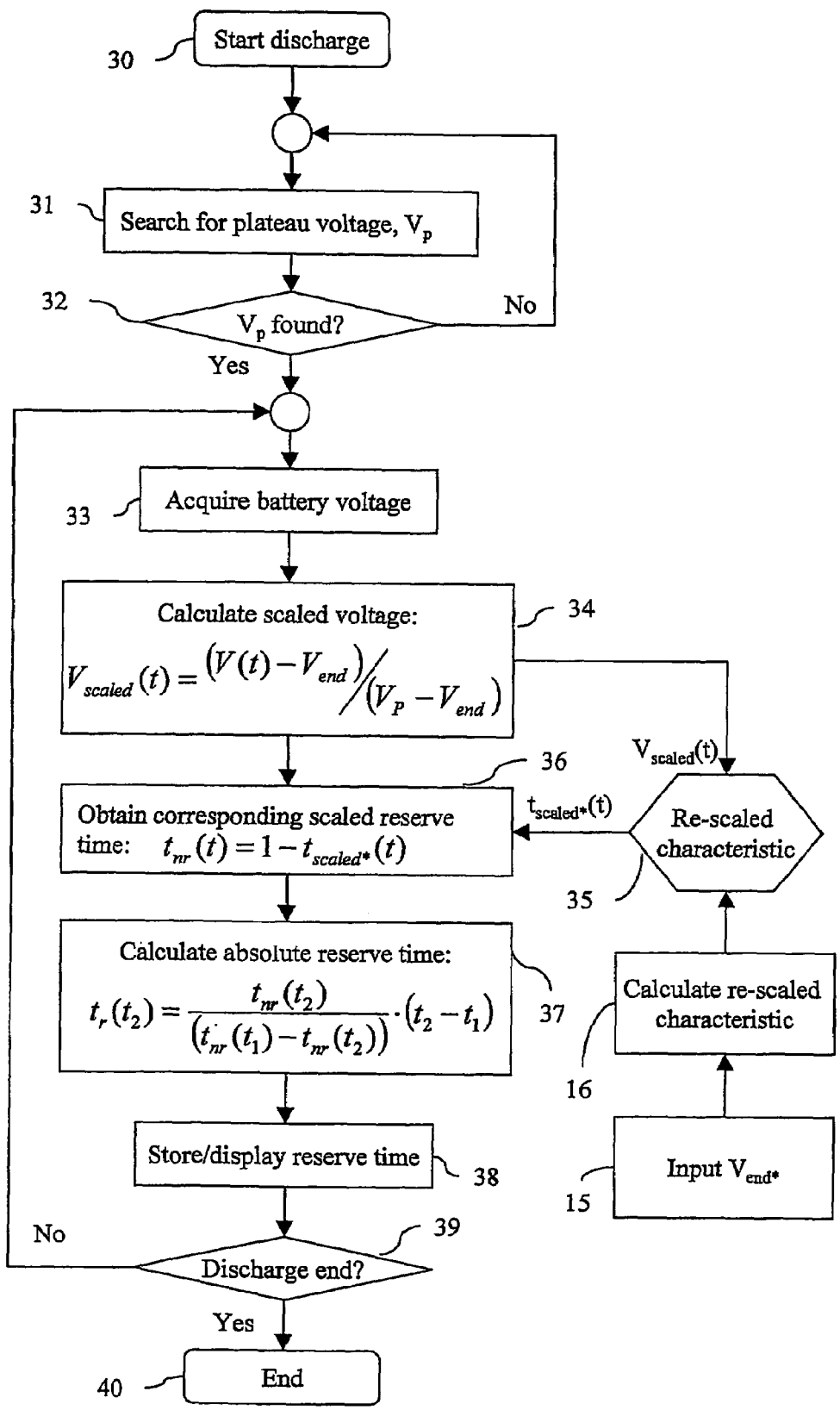
Figure 8:
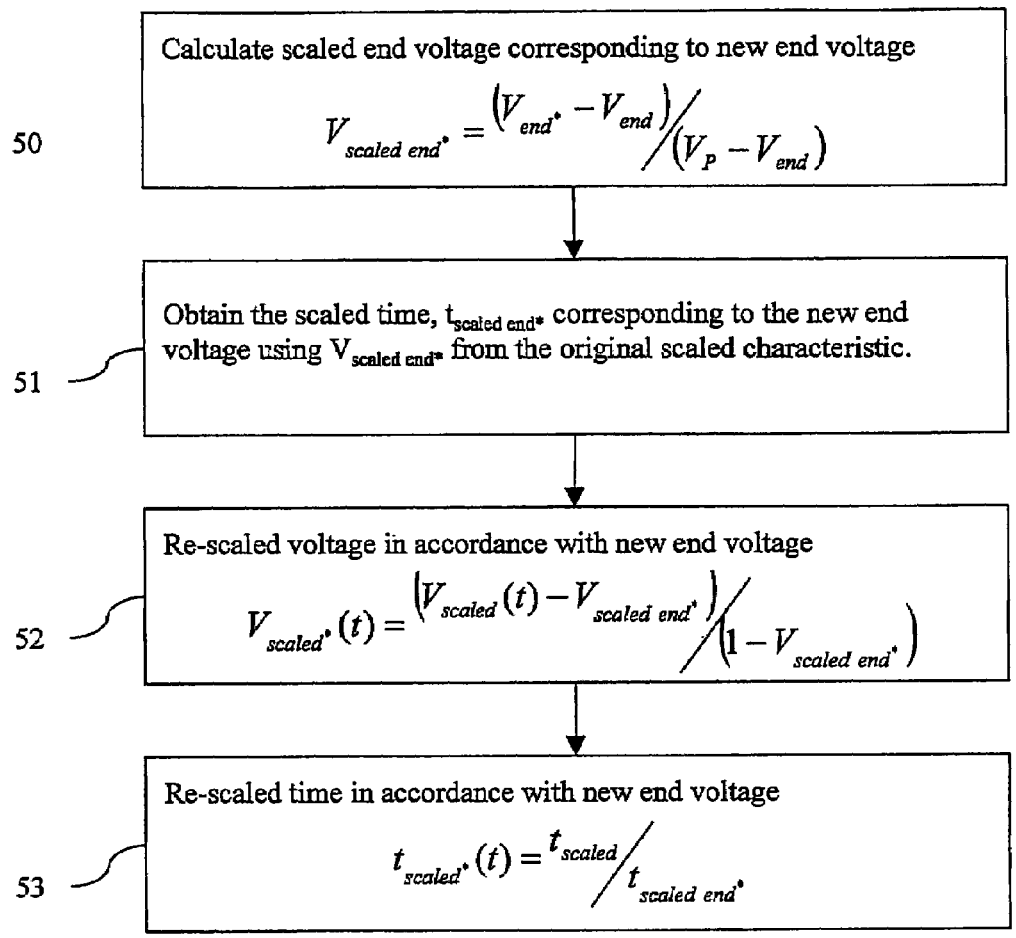
Figure 9:
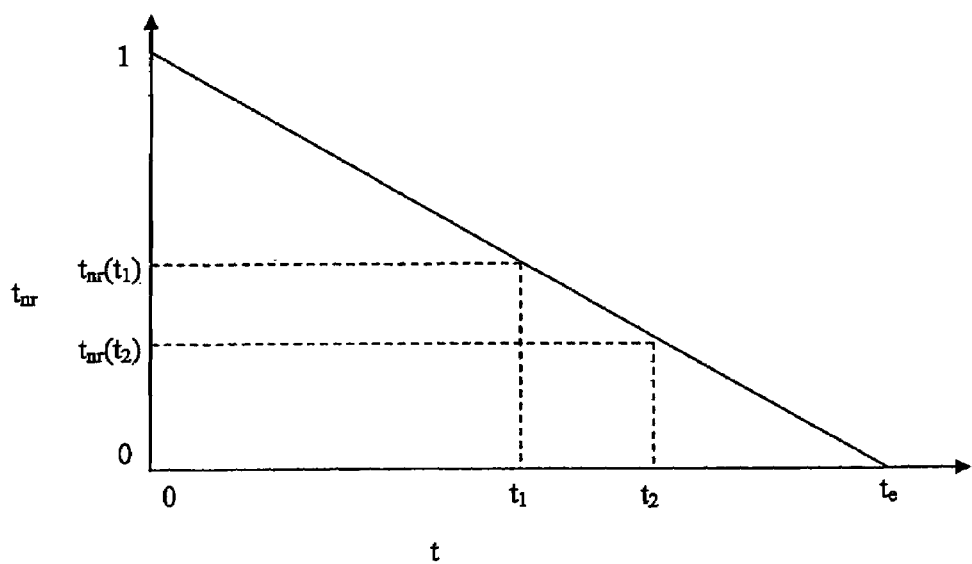

FIG. 7 is a flowchart showing the calculation of reserve time during a discharge;

FIG. 8 is a flowchart showing the re-scaling of the scaled discharge characteristic for an application end voltage; and FIG. 9 is a graph of scaled reserve time against time.

Figure 1:
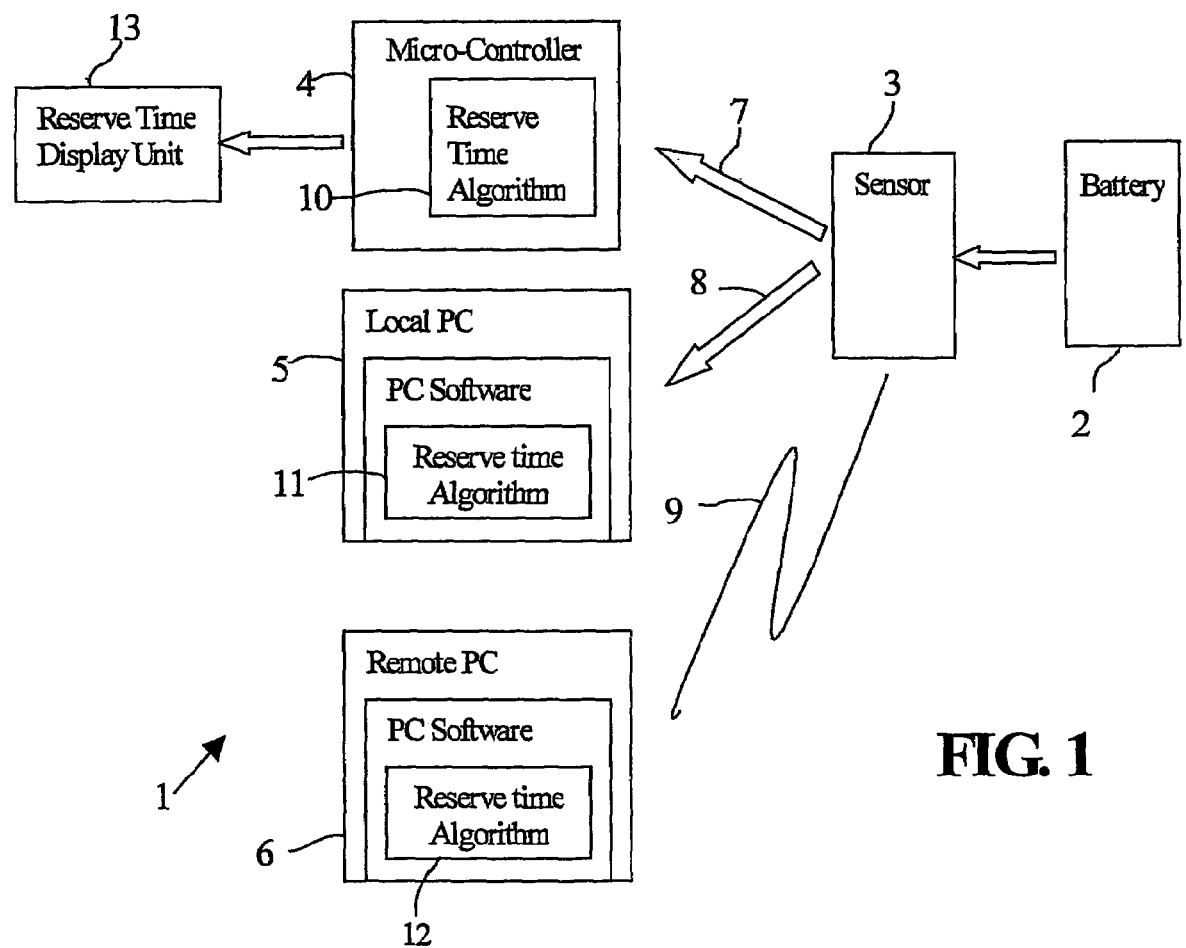
FIG. 1 is a schematic diagram showing a battery reserve time estimation system.

Referring to FIG. 1, a system 1 for estimating the reserve time of a battery 2 includes a sensor 3 for acquiring voltage readings from the battery 2. The battery 2 could be a single cell, a group of cells or mono-blocs, a string of cells or a multiple string battery. The sensor 3 samples closed circuit battery voltage at regular intervals that are significant compared to the discharge duration. Sensing accuracy and resolution should be sufficient to the degree of relevance of application.

The system 1 incorporates three alternative processors which can receive and process the voltage readings. These processors can be run together or individually. Specifically, micro-controller 4, local personal computer (PC) 5 or remote PC 6 can receive data via fixed links 7, 8 or wireless link 9. The links 7-9 could either be based on standard or proprietary protocols. The fixed links 7, 8 could be serial or parallel.

The processors each contain respective memories 10-12 which contain reserve time algorithm software for performing the processing steps described below. The software written could be embedded within the micro-controller 4 or PC 5, 6, or could be provided as a software package (like a spreadsheet).

The PCs 5, 6 each have respective displays (not shown) for displaying reserve time information; and the micro-controller 4 is connected to a display unit 13.

Figure 2:
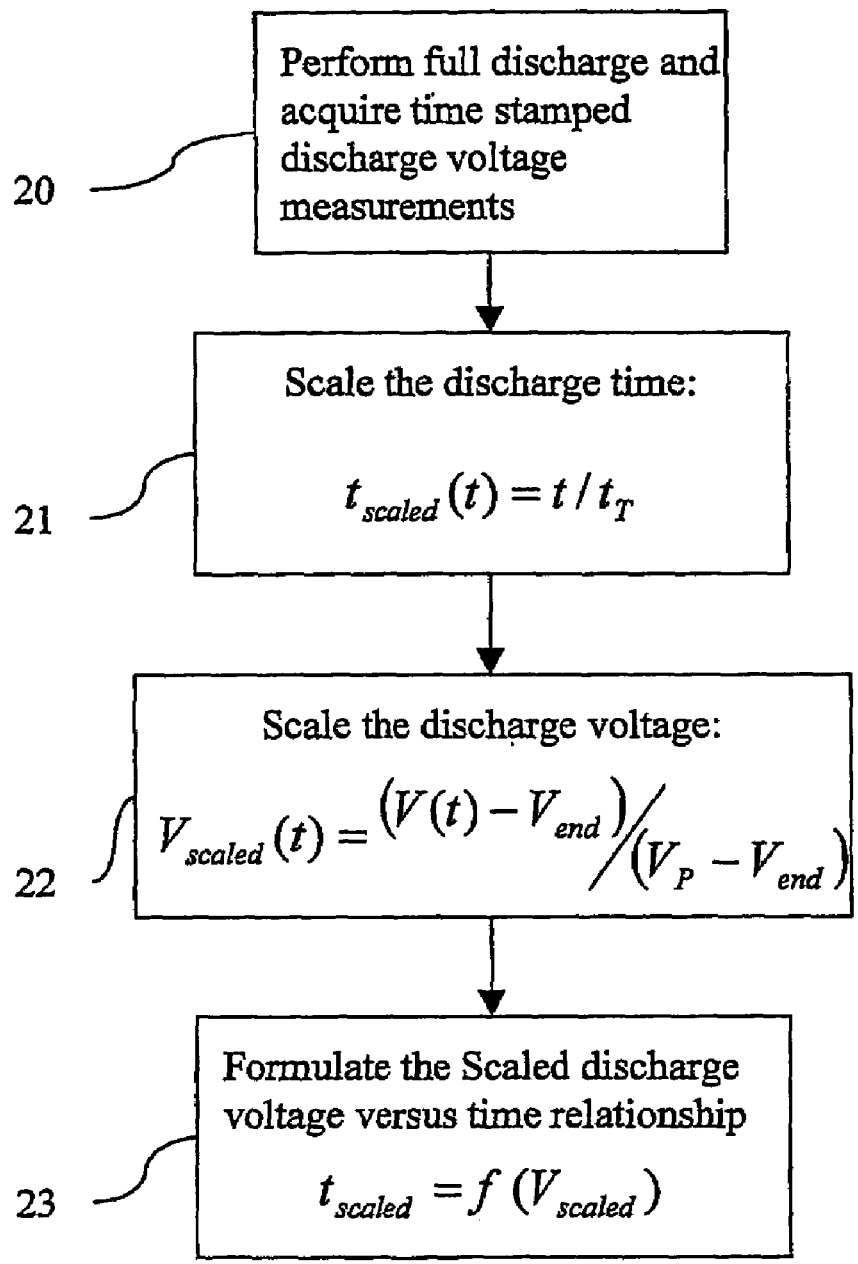
FIG. 2 is a flowchart showing the formulation of a scaled characteristic.

In a first process shown in steps 20-23 FIG. 2, a scaled discharge characteristic is formulated. This formulation process may be performed by a customer, or in the factory prior to supplying the algorithm to the customer in the form of computer software, which may be provided on a disk or other storage medium, or may be transmitted to the customer by email. In the example given below, micro-controller 4 is used. In a characterisation discharge test 20, an ensemble of discharge voltage readings V(t) are acquired from a VRLA battery during a single deep discharge to a predetermined system end voltage $V_{end}$. The discharge voltage readings V(t) are time stamped with time t by micro-controller 4 (which contains a timer, not shown) and stored in memory 10. The time stamp associated with the end voltage $V_{end}$ is designated as $t_T$.

This ensemble of discharge readings (V,t) is then processed by micro-controller 4 to formulate a scaled voltage time relationship (referred to herein as a scaled discharge characteristic) as expressed by equation 1 below. This could be a semi-empirical representation supported by a lookup table. It could also be a fully analytical expression.

$$t_{scaled} = f(V_{scaled}) \qquad \text{equation 1}$$

The approach requires scaling of both voltage and time values based on the data gathered from the characterisation discharge test above.

In step 21, the time readings t are scaled to the maximum discharge time $t_T$. This is expressed by equation 2

$$t_{scaled}(t) = t/t_T \qquad \text{equation 2}$$

where: $t_{scaled}(t)$ is scaled discharge time at time t;

t is discharge elapse time; and $t_T$ is total discharge time.

Zero time (t=0) corresponds with zero scaled time and to the occurrence of a start voltage (see equation 3 below).

The voltage readings V(t) are also scaled in step 22 using a start voltage and the end voltage $V_{end}$. The start voltage may be taken to be a trough voltage, plateau voltage $V_p$ or a voltage corresponding to a particular amount of charge being released from the battery. As the plateau voltage $V_p$ is the highest voltage encountered during the discharge using it will place an upper bound of unity on the scaled voltage. For the remainder of this description the start voltage is assumed to be the plateau voltage $V_p$.

The end voltage $V_{end}$ employed is that at which the discharge is terminated. To provide the widest application coverage this end voltage $V_{end}$ is chosen to be very low—lower than any end voltage that is likely to be encountered within the application of interest. The voltage scaling process is expressed by equation 3

$$V_{scaled}(t) = \frac{(V(t) - V_{end})}{(V_P - V_{end})} \qquad \text{equation 3}$$

where: $V_{scaled}(t)$ is the scaled discharge voltage at time t;

V(t) is the discharge voltage at time t;

$V_{end}$ is the system end voltage; and $V_p$ is the discharge plateau (start) voltage.

Thus for each scaled voltage $V_{scaled}(t)$ at time t, there exists a corresponding scaled time $t_{scaled}(t)$ at time t. Hence, in step 23 the scaled discharge characteristic expressed by equation 1 is formulated and stored in memory 10 as a lookup table, analytical expression etc.

Figure 3:
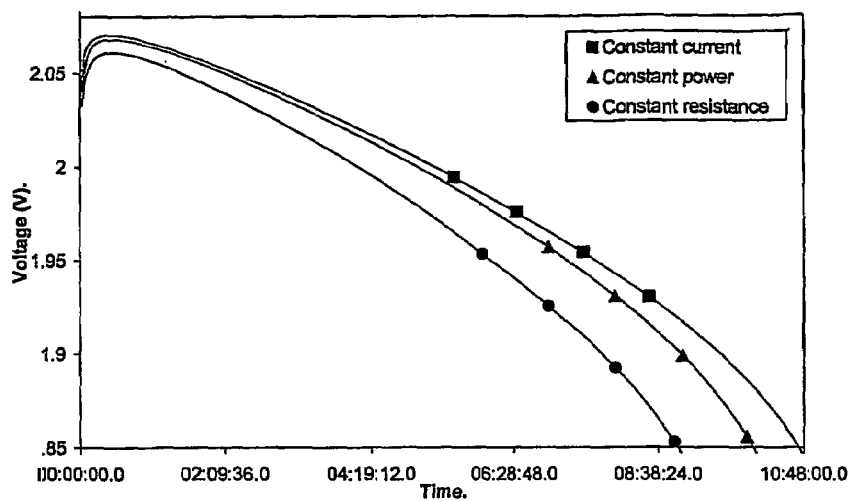
Figure 3:
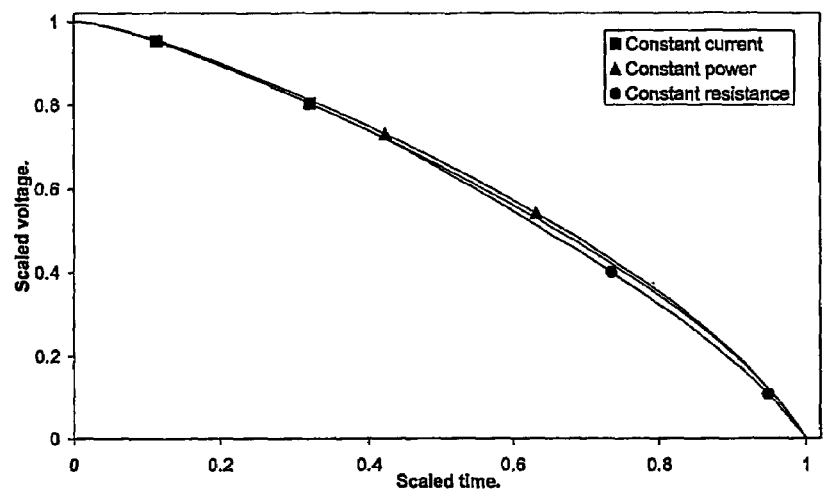
Figure 3:
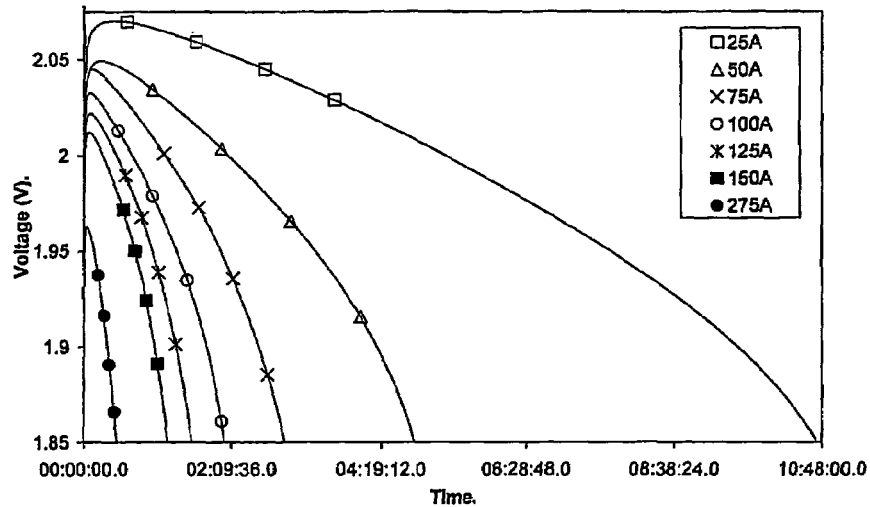
Figure 3:
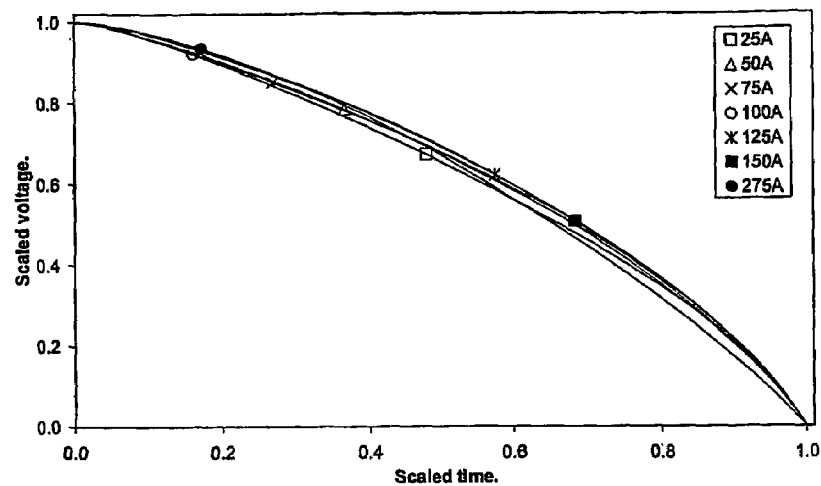
Figure 3:
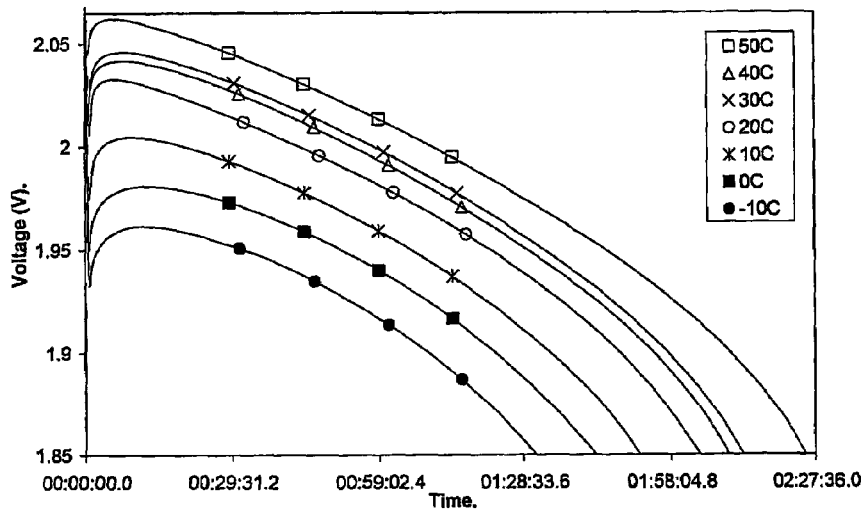
Figure 3:
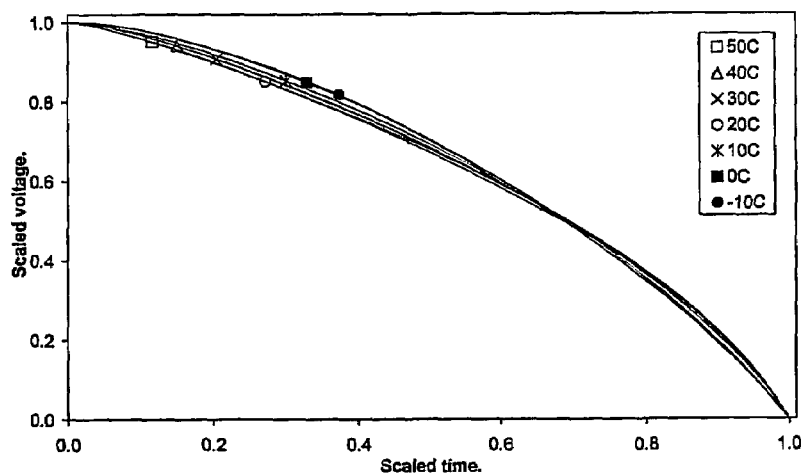
Figure 4:
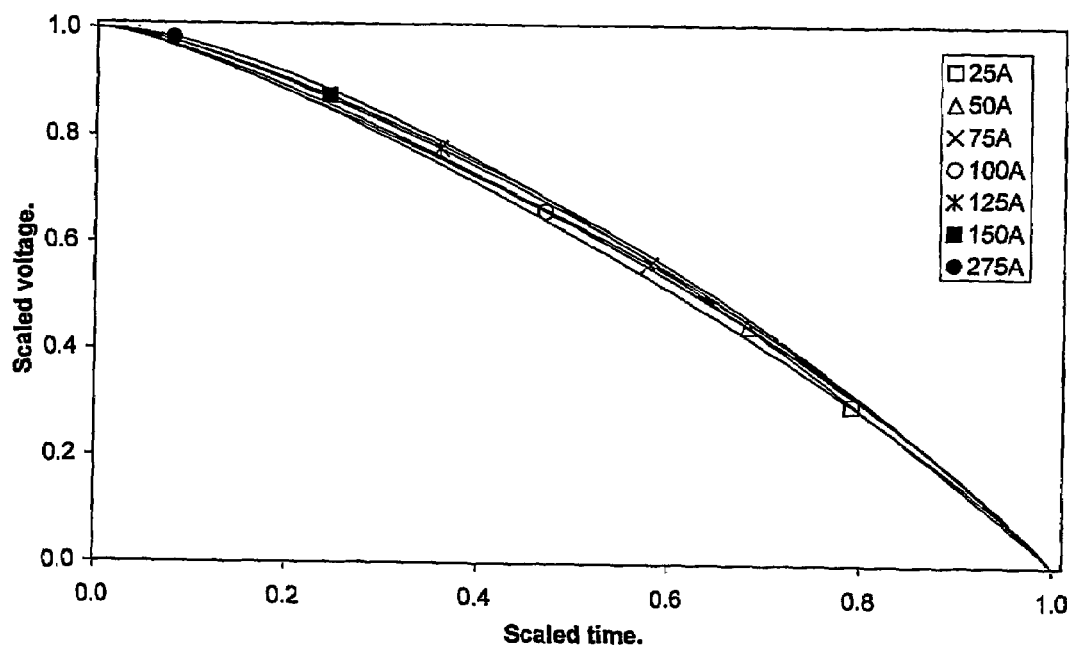
Figure 4:
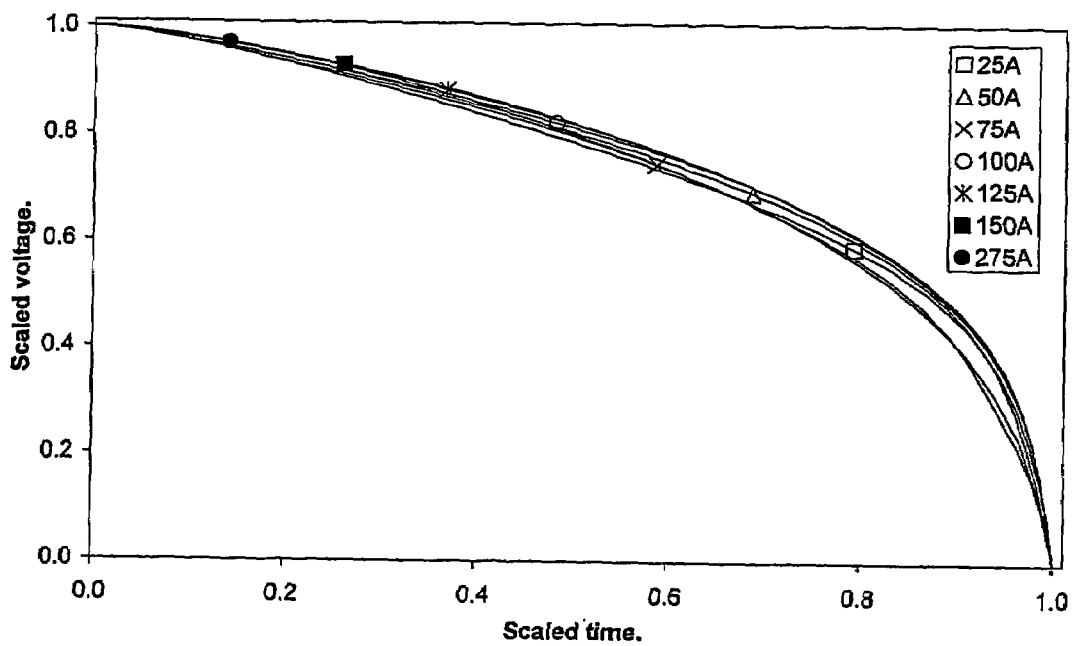
Figure 5:
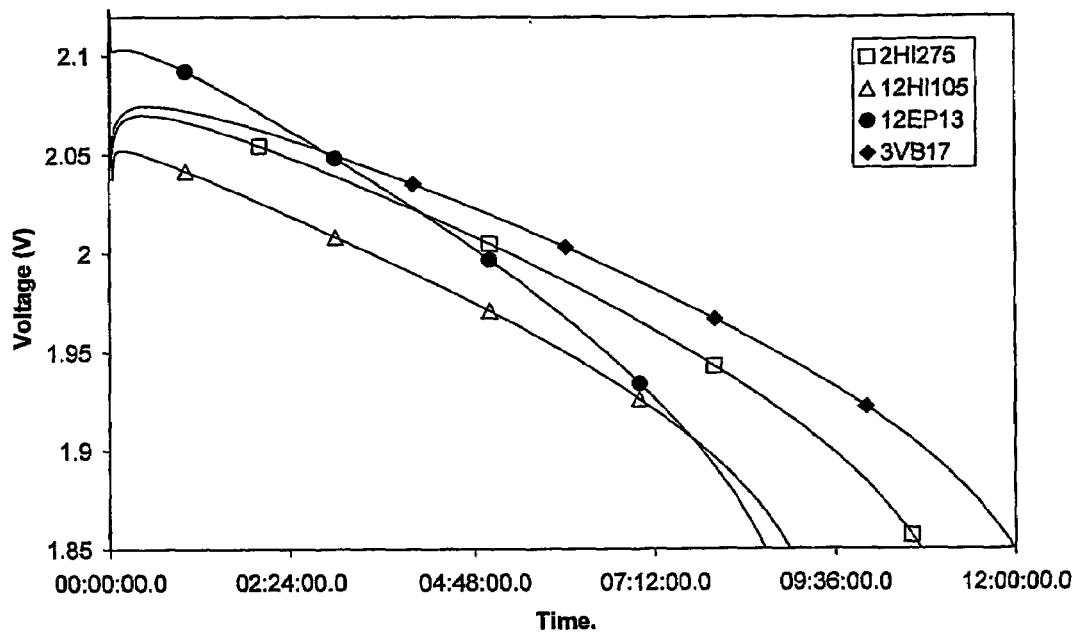
Figure 5:
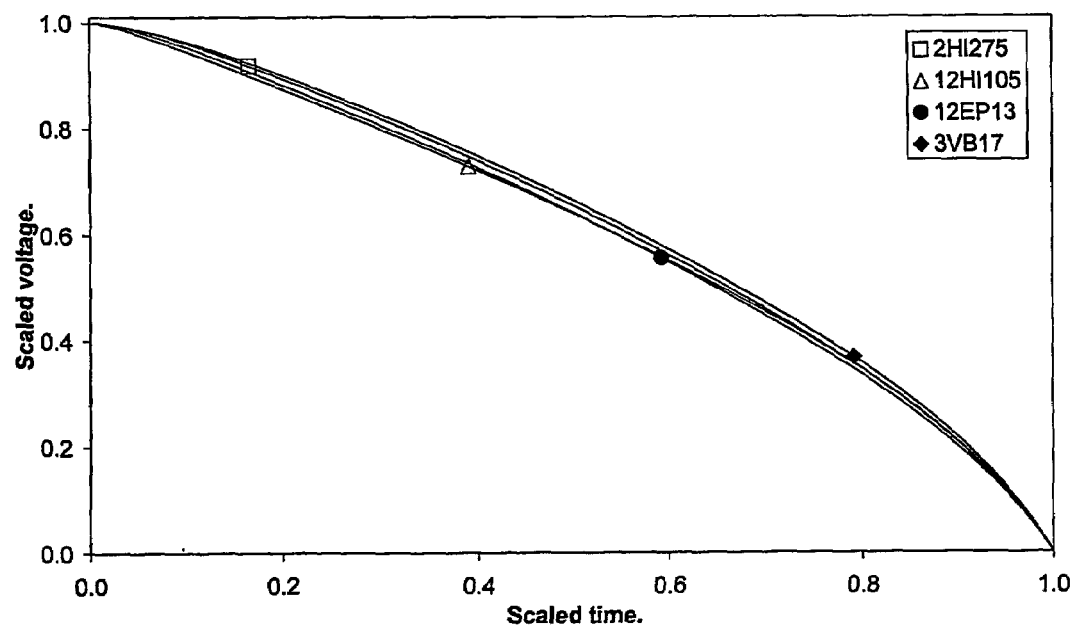

To illustrate the uniformity of the scaling process against variations in operating and battery conditions, a number of cases studies are presented in FIGS. 3-5.

FIGS. 3a)-3f) show the discharge voltage versus time characteristics of an Oldham 2HI275 cell and the corresponding scaled discharge characteristics $V_{scaled}(t)$, $t_{scaled}(t)$ using equations 2 and 3 for equivalent constant current, power and resistance discharges; a) and b) respectively, for discharges at various rates; c) and d) respectively, and for discharges at various ambient temperatures; e) and f) respectively.

FIGS. 4a) and 4b) show the scaled discharge characteristics of the discharges of FIG. 3 c) using a) 1.9V and b) 1.65 as the end voltage.

FIGS. 5a) and 5b) show the a) discharge voltage versus time and b) scaled discharge characteristics of different battery types.

FIGS. 6a)-6f) show the discharge voltage versus time characteristics and the corresponding scaled discharge characteristics for field aged cells; a) and b) respectively, thermally accelerated aged cells; c) and d) respectively, and water replenished thermally accelerated aged cells; e) and f) respectively.

Figure 6:
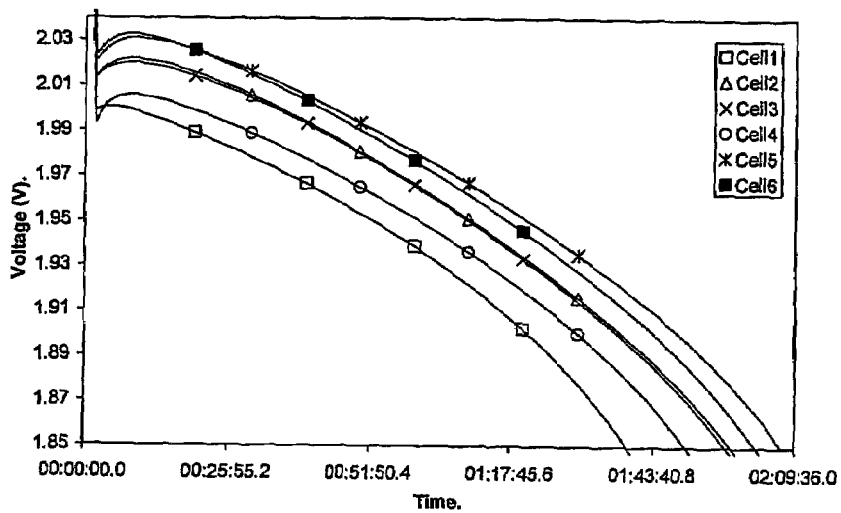
Figure 6:
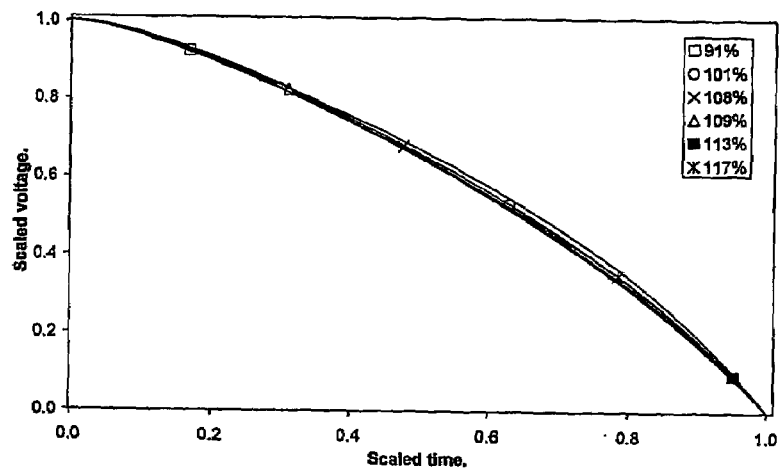
Figure 6:
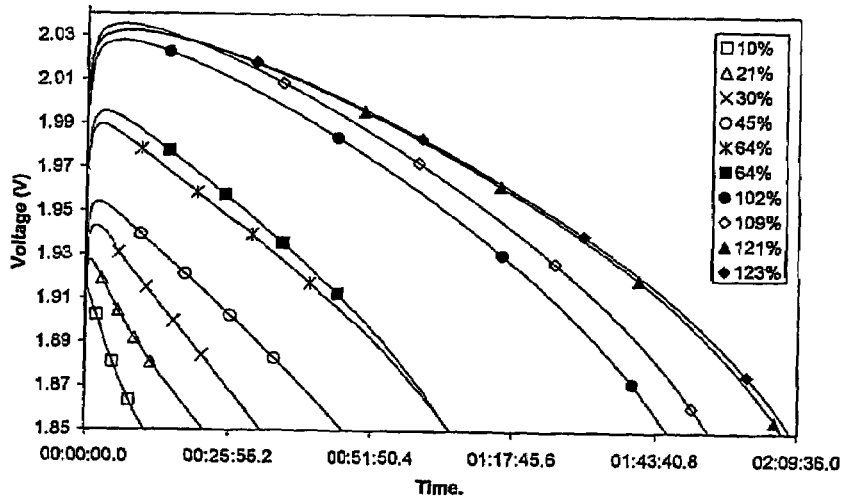
Figure 6:
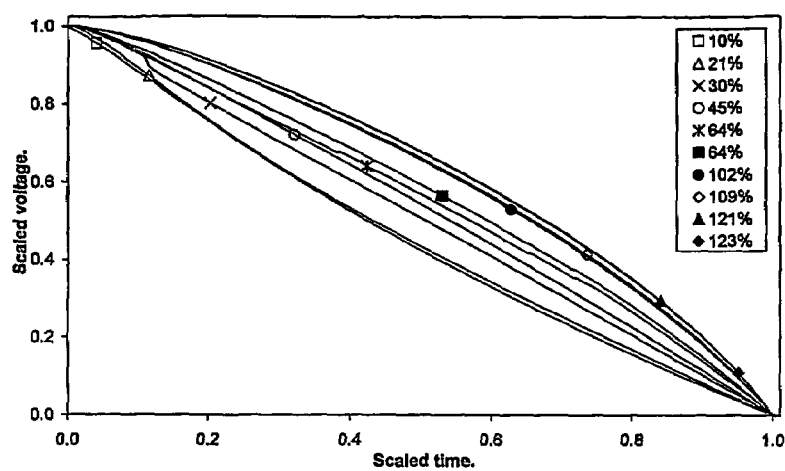
Figure 6:
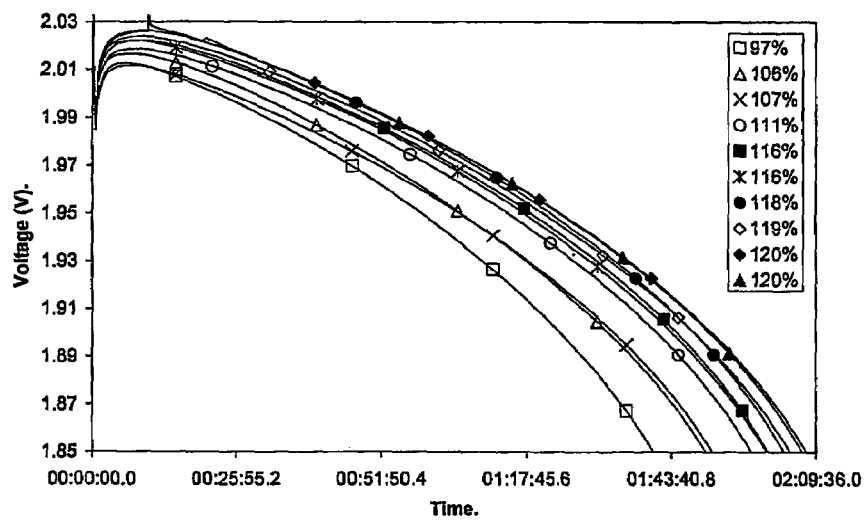
Figure 6:
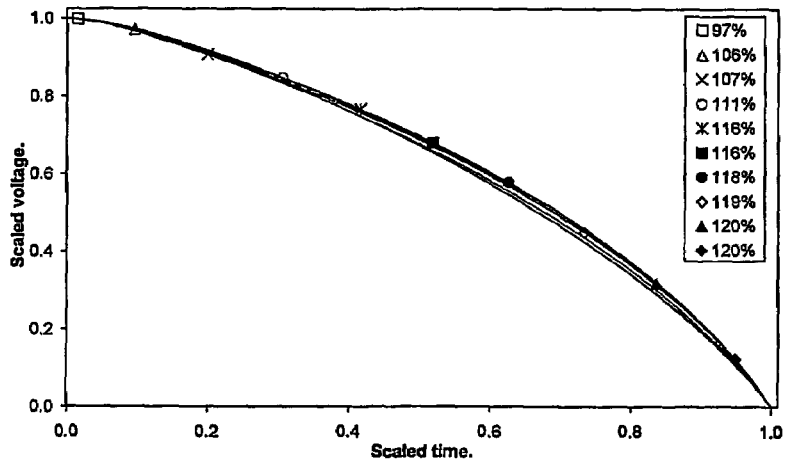

It can be appreciated from FIGS. 3-6 that the scaled discharge characteristics are substantially uniform across different operating conditions (FIG. 3), battery types (FIG. 5) and battery types (FIG. 6).

Once a scaled discharge characteristic has been obtained, it can then be used to monitor the reserve times of different batteries using the process shown in FIGS. 7 and 8.

In step 30, the discharge starts and the algorithm running on micro-controller 4 (or PCs 5,6) searches for the plateau voltage $V_p$ in step 31. When the voltage $V_p$ is reached in step 32, the plateau voltage is stored in step 33. In step 34, a scaled voltage $V_{scaled}(t)$ is calculated using equation 3 above with an application end voltage $V_{end}^*$ which has been previously input by the user in step 15. In the first iteration of step 34, the scaled voltage will have a value of unity.

Before employing the scaled discharge characteristic, it must be scaled in accordance with the end voltage $V_{end}^*$. As mentioned above, the scaled discharge characteristic of equation 1 was generated utilising a very low end voltage $V_{end}$. Thus, zero scaled time will correspond to this end voltage $V_{end}$ and not the application end voltage $V_{end}^*$. However, the scaled discharge characteristic contains the necessary information to allow it to be re-scaled to the application end voltage $V_{end}^*$. This re-scaling process is described by equations 4, 5 and 6 below.

$$V_{scaled\ end}^* = \frac{(V_{end}^* - V_{end})}{(V_P - V_{end})} \quad \text{equation 4}$$

$$V_{scaled}^*(t) = \frac{(V_{scaled}(t) - V_{scaled\ end}^*)}{(1 - V_{scaled\ end}^*)} \quad \text{equation 5}$$

$$t_{scaled}^*(t) = \frac{t_{scaled}}{t_{scaled\ end}^*} \quad \text{equation 6}$$

where: $V_{end}^*$ is the new end voltage;

$V_{scaled\ end}^*$ is the scaled application end voltage;

$t_{scaled\ end}^*$ is the scaled time corresponding to the application end voltage;

$V_{scaled}^*(t)$ is the re-scaled voltage employing the application end voltage; and $t_{scaled}^*(t)$ is the re-scaled time employing the application end voltage.

In step 15 the application end voltage $V_{end}^*$ is input by an operator. In step 16 the algorithm of FIG. 8 is performed. Thus, the application end voltage, $V_{end}^*$, is input into the original scaled discharge characteristic ($V_{scaled}$, $t_{scaled}$) to determine the corresponding scaled new end voltage, $V_{scaled\ end}^*$ (equation 4, step 50). This can then be used to determine the corresponding scaled time, $t_{scaled\ end}^*$ (step 51). The re-scaled voltage, $V_{scaled}^*(t)$, is then determined using equation 5 (step 52). The re-scaled time, $t_{scaled}^*(t)$, is then determined using equation 6 (step 53). This process is then repeated for each value of $V_{scaled}(t)$ and stored as a re-scaled discharge characteristic.

Note: it is essential that $V_{end}^* \leq V_{end}$. This is why it is necessary to obtain the original scaled discharge characteristic utilising as low an end voltage as possible/necessary. Note also that steps 15 and 16 are only performed once for a given end voltage, and do not need to be repeated for each iteration of FIG. 7.

In step 35 the scaled voltage $V_{scaled}(t)$ is input into the previously stored re-scaled discharge characteristic to determine the re-scaled time $t_{scaled}^*(t)$. The scaled reserve time $t_{nr}$ is then calculated from the re-scaled time in step 36 as described by equation 7 below $$t_{nr}(t) = 1 - t_{scaled}^*(t) \quad \text{equation 7}$$

An estimate of the absolute reserve time, $t_r$, can then be obtained from the scaled reserve time estimation in step 37 using equation 8 below $$t_r(t_2) = \frac{t_{nr}(t_2)}{(t_{nr}(t_1) - t_{nr}(t_2))} \cdot (t_2 - t_1) \quad \text{equation 8}$$

where: $t_{nr}(t_1)$ and $t_{nr}(t_2)$ are the estimated scaled reserve times corresponding to discharge elapse times from the occurrence of the plateau voltage of $t_1$ and $t_2$ respectively Note that step 37 is omitted in the first iteration (at which point only a single voltage reading has been acquired).

The duration between $t_1$ and $t_2$ must be long enough for the discharge voltage to change sufficiently, i.e. the discharge voltage samples (and thus the fractional reserve time estimations) must be monotonically decreasing.

The derivation of equation 8 will now be explained with reference to FIG. 9. We assume that the scaled reserve time $t_{nr}$ and time t are related by a linear function $t_{nr} = 1 - kt$, where k is the gradient of the line shown in FIG. 9. This gradient k can be derived from two subsequent readings as:

$$k = \frac{(t_2 - t_1)}{t_{nr}(t_2) - t_{nr}(t_1)} \quad \text{equation 9}$$

We are specifically interested in the change in estimated scaled reserve time between the present discharge elapse time ($t_2$) and the discharge elapse time corresponding to the end of the discharge ($t_e$).

Put another way we wish to find a time, $t_r(t_2)$ that is the difference between the present discharge elapse time ($t_2$) and the time coinciding with the end of the discharge ($t_e$).

This change in discharge elapse time will coincide with a change in scaled reserve time from the present value, $t_{nr}(t_2)$ to the scaled reserve time that coincides with the end of the discharge. We know that at the end of the discharge the scaled reserve time equals zero.

Putting all of this together we have the derivation of equation 8 detailed by equation 10 below $$t_r(t_2) = (t_e - t_2)$$ equation 10
$$= (t_{nr}(t_e) - t_{nr}(t_2)) \cdot k$$
$$= (t_{nr}(t_2) - t_{nr}(t_e)) \frac{(t_2 - t_1)}{(t_{nr}(t_1) - t_{nr}(t_2))}$$
$$= t_{nr}(t_2) \frac{(t_2 - t_1)}{(t_{nr}(t_1) - t_{nr}(t_2))}$$

Returning now to FIG. 7, in step 38 the calculated reserve time $t_r$ is stored in memory and/or displayed. This could either be displayed as a linguistic fuzzy value, a bar graph, indicative LED or precise numerical form. Each of these could either be on an LCD or VDU display. LED displays may also be used to indicate threshold crossing.

The processor then determines in step 39 whether the last voltage reading is equal to $V_{end}*$. If so, the algorithm ends at 40.

The method typically does not require battery current to be measured.

Although using a battery discharge characteristic that has been derived from one battery type, of a given size, at a given condition has proven to be useful in representing other types, sizes and conditions, customising the characteristic (to the specific battery type and condition) can provide further precision in estimating reserve time.

While the present invention has been illustrated by the description of the embodiments thereof, and while the embodiments have been described in detail, it is not the intention of the Applicant to restrict or in any way limit the scope of the appended claims to such detail. Additional advantages and modifications will readily appear to those skilled in the art. Therefore, the invention in its broader aspects is not limited to the specific details, representative apparatus and method, illustrative examples shown and described. Accordingly, departures may be made from such details without departure from the spirit or scope of the Applicant's general inventive concept.

The invention claimed is:

1. A method of battery monitoring comprising the following steps performed in a computer:
   a) acquiring a battery voltage measurement from the battery;
   b) acquiring a time measurement associated with the battery voltage measurement acquired in step a);
   c) determining a scaled voltage value by scaling the battery voltage measurement made in step a) with respect to a predetermined end voltage;
   d) determining a scaled time value from the scaled voltage value determined in step c) in accordance with a predetermined battery characteristic;
   e) estimating a reserve time from the scaled time value determined in step d), the reserve time being indicative of the difference between the time measurement acquired in step b) and an end time associated with the predetermined end voltage; and
   f) communicating the estimated reserve time.

2. A method of battery monitoring comprising the following steps performed in a computer:
   a) acquiring a battery voltage measurement from the battery;
   b) acquiring a time measurement associated with the battery voltage measurement acquired in step a);
   c) determining a scaled voltage value by scaling the battery voltage measurement made in step a) with respect to a start voltage and a predetermined end voltage;
   d) determining a scaled time value from the scaled voltage value determined in step c) in accordance with a predetermined battery discharge characteristic;
   e) estimating an absolute time value from the scaled time value determined in step d); and
   f) communicating the estimated absolute time value.

3. A method according to claim 2 wherein the absolute time value is a reserve time indicative of the difference between the time measurement acquired in step b) and an end time associated with the predetermined end voltage.

4. A method according to claim 2 further including performing one or more additional repeats of steps a) -e) during a single battery discharge.

5. A method according to claim 4 wherein step e) includes the steps of: e) i) determining the difference between a lower time measurement and an upper time measurement; e) ii) determining the difference between a pair of scaled time values associated with the lower and upper time measurements; and e) iii) determining the ratio of the differences determined in steps e) i) and e) ii).

6. A method according to claim 5 wherein the lower and upper time measurements change for each repeat of step e).

7. A method according to claim 6 wherein the lower and upper time measurements are associated with a pair of adjacent repeats.

8. A method according to claim 5 wherein the lower time measurement is the same for each repeat of step e), and the upper time measurement changes for each repeat of step e).

9. A method according to claim 4 wherein the battery voltage measurements include a measured start voltage, and wherein the scaled voltage value is determined in step c) by sealing the battery voltage measurement with respect to the measured start voltage and the predetermined end voltage.

10. A method according to claim 2 further including the step of receiving and storing the predetermined end voltage.

11. A method according to claim 10 further including the step of re-scaling the battery discharge characteristic in accordance with the stored end voltage.

12. A method comprising the following steps performed by a computer:
    a) acquiring a plurality of battery voltage measurements from a battery, the battery voltage measurements including a start voltage and an end voltage;
    b) acquiring a plurality of time measurements, each time measurement being associated with a respective battery voltage measurement, the time measurements including an end time associated with the end voltage;
    c) determining a plurality of scaled voltage values by scaling each battery voltage measurement with respect to the start voltage and the end voltage;
    d) determining a plurality of scaled time values by scaling each time measurement with respect to the end time;
    e) determining a battery discharge characteristic indicative of a relationship between the scaled voltage values and the scaled time values;
    f) generating a capacity estimate from battery voltage measurements using the determined battery discharge characteristic; and
    g) communicating the estimated capacity estimate.

13. A computer-readable storage medium comprising computer program code embodied therein, the computer program code configured to implement the method of claim 12.

14. A system configured to implement the method of claim 12, the system including a sensor configured to acquire the battery voltage measurements; a timer configured to generate the time measurements; and a processor configured to perform steps c) to g).

15. A system according to claim 14 further including a store configured to store the result of step e).

16. A system according to claim 14 further including one or more output devices configured to output the result of step f).

17. A system according to claim 16 wherein the output device is a display unit.

18. A computer readable storage medium containing a battery discharge characteristic which has been determined by the method of claim 12.

19. A method according to claim 1 further including performing one or more additional repeats of steps a) -e) during a single battery discharge.

20. A method according to claim 19 wherein step e) includes the steps of: e) i) determining the difference between a lower time measurement and an upper time measurement; e) ii) determining the difference between a pair of scaled time values associated with the lower and upper time measurements; and e) iii) determining the ratio of the differences determined in steps e) i) and e) ii).

21. A method according to claim 20 wherein step e) includes the steps of: e) i) determining the difference between a lower time measurement and an upper time measurement; e) ii) determining the difference between a pair of scaled time values associated with the lower and upper time measurements; and e) iii) determining the ratio of the differences determined in steps e) i) and e) ii).

22. A method according to claim 21 wherein the lower and upper time measurements change for each repeat of step e).

23. A method according to claim 22 wherein the lower and upper time measurements are associated with a pair of adjacent repeats.

24. A method according to claim 21 wherein the lower time measurement is the same for each repeat of step e), and the upper time measurement changes for each repeat of step e).

25. A method according to claim 20 wherein the battery voltage measurements include a measured start voltage, and wherein the sealed voltage value is determined in step c) by scaling the battery voltage measurement with respect to the measured start voltage and the predetermined end voltage.

26. A method according to claim 1 further including the step of receiving and storing the predetermined end voltage.

27. A method according to claim 26 further including the step of re-scaling the battery discharge characteristic in accordance with the stored end voltage.

28. A computer-readable storage medium comprising computer program code embodied therein, the computer program code configured to implement the method of claim 1.

29. A computer-readable storage medium comprising computer program code embodied therein, the computer program code configured to implement the method of claim 2.

30. A system configured to implement the method of claim 1, the system including a sensor configured to acquire the battery voltage measurements; a timer configured to generate the time measurements; and a processor configured to perform steps c) to f).

31. A system according to claim 30 further including a store configured to store the result of step e).

32. A system according to claim 30 further including one or more output devices configured to output the result of step e).

33. A system according to claim 32 wherein the output device is a display unit.

34. A system configured to implement the method of claim 2, the system including a sensor configured to acquire the battery voltage measurements; a timer configured to generate the time measurements; and a processor configured to perform steps c) to f).

35. A system according to claim 34 further including a store configured to store the result of step e).

36. A system according to claim 34 further including one or more output devices configured to output the result of step e).

37. A system according to claim 36 wherein the output device is a display unit.

* * * * *

UNITED STATES PATENT AND TRADEMARK OFFICE
CERTIFICATE OF CORRECTION

PATENT NO. : 7,402,980 B2  
APPLICATION NO. : 10/559367  
DATED : July 22, 2008  
INVENTOR(S) : Al-Anbuky et al.

Page 1 of 1

It is certified that error appears in the above-identified patent and that said Letters Patent is hereby corrected as shown below:

Column 8, Claim 9, Line 35: Please correct "sealing"
To read -- scaling --

Column 10, Claim 25, Line 1: Please correct "wherein the sealed"
To read -- wherein the scaled --

Signed and Sealed this

Thirtieth Day of September, 2008

JON W. DUDAS
*Director of the United States Patent and Trademark Office*